United States Patent
Nishimoto (10) Patent No.: US 10,393,925 B2
(45) Date of Patent: Aug. 27, 2019

(54) SPECTACLE LENS, METHOD OF MANUFACTURING THE SAME, AND SPECTACLES

(71) Applicant: HOYA LENS THAILAND LTD., Prachatipat, Thanyaburi, Pathumthani (TH)

(72) Inventor: Keiji Nishimoto, Tokyo (JP)

(73) Assignee: HOYA LENS THAILAND LTD., Pathumthani (TH)

(*) Notice: Subject to any disclaimer, the term of this patent is extended or adjusted under 35 U.S.C. 154(b) by 104 days.

(21) Appl. No.: 15/718,313

(22) Filed: Sep. 28, 2017

(65) Prior Publication Data
US 2018/0017716 A1    Jan. 18, 2018

Related U.S. Application Data

(63) Continuation of application No. PCT/JP2016/060704, filed on Mar. 31, 2016.

(30) Foreign Application Priority Data

Mar. 31, 2015  (JP) ................. 2015-073844

(51) Int. Cl.
| | | |
|---|---|---|
| B32B 15/04 | (2006.01) | |
| B32B 17/06 | (2006.01) | |
| G02B 1/16 | (2015.01) | |
| G02B 1/116 | (2015.01) | |
| G02C 7/02 | (2006.01) | |
| C23C 14/00 | (2006.01) | |
| C23C 14/08 | (2006.01) | |
| C23C 14/24 | (2006.01) | |
| C23C 14/58 | (2006.01) | |

(52) U.S. Cl.
CPC ............ *G02B 1/16* (2015.01); *C23C 14/0021* (2013.01); *C23C 14/086* (2013.01); *C23C 14/24* (2013.01); *C23C 14/5833* (2013.01); *G02B 1/116* (2013.01); *G02C 7/02* (2013.01)

(58) Field of Classification Search
USPC ......................... 428/426, 428, 432, 434, 688
See application file for complete search history.

(56) References Cited

U.S. PATENT DOCUMENTS 4,715,879 A * 12/1987 Schmitte ................. C03C 17/36
65/106
6,852,406 B2 * 2/2005 Marechal ............... G02B 1/116
428/336

(Continued)

FOREIGN PATENT DOCUMENTS

| CN | 101782663 A | 7/2010 |
|---|---|---|
| JP | S62-158139 A | 7/1987 |

(Continued)

OTHER PUBLICATIONS

Feb. 14, 2018 Office Action issued in Australian Patent Application No. 2016240877.

(Continued)

*Primary Examiner* — Lauren R Colgan
(74) *Attorney, Agent, or Firm* — Oliff PLC (57) ABSTRACT

Provided are a spectacle lens having a tin oxide layer on a lens base material, wherein the tin oxide layer has a composition gradient in which an oxygen content rate as anatomic percentage increases from the lens base material side to the other side, and spectacles provided with the spectacle lens.

8 Claims, 5 Drawing Sheets

(56) References Cited

U.S. PATENT DOCUMENTS

| | | | |
|---|---|---|---|
| 8,789,944 B2* | 7/2014 | Nishimoto | C23C 14/083 351/159.01 |
| 9,703,011 B2* | 7/2017 | Adib | G02B 1/105 |
| 2002/0055005 A1* | 5/2002 | Miyasaka | B01J 35/002 428/472 |
| 2003/0086056 A1* | 5/2003 | Gupta | G02C 7/061 351/159.42 |
| 2005/0227085 A1 | 10/2005 | Okada et al. | |
| 2007/0219087 A1* | 9/2007 | Miyasaka | A61L 9/22 502/300 |
| 2009/0141357 A1* | 6/2009 | Kamura | C23C 14/083 359/585 |
| 2010/0177395 A1 | 7/2010 | Nishimoto et al. | |
| 2012/0013845 A1* | 1/2012 | Conte | G02B 1/10 351/159.62 |
| 2016/0070033 A1* | 3/2016 | Schlott | C23C 14/08 428/216 |
| 2017/0219750 A1* | 8/2017 | Nakanishi | B32B 7/02 |

FOREIGN PATENT DOCUMENTS

| | | |
|---|---|---|
| JP | H07-151737 A | 6/1995 |
| JP | H07-281209 A | 10/1995 |
| JP | 2002-085981 A | 3/2002 |
| JP | 2005-320532 A | 11/2005 |
| JP | 2012-522259 A | 9/2012 |
| TW | 498014 B | 8/2002 |

OTHER PUBLICATIONS

Jul. 19, 2018 Office Action issued in Canadian Patent Application No. 2,981,263.

Sep. 6, 2018 Office Action issued in Korean Patent Application No. 10-2017-7027215.

Oct. 18, 2018 Extended European Search Report issued in Patent Application No. 16773132.2.

Oct. 22, 2018 Office Action issued in Chinese Patent Application No. 201680017411.9.

Jun. 7, 2016 International Search Report issued in International Patent Application No. PCT/JP2016/060704.

Oct. 3, 2017 International Preliminary Report on Patentability issued in International Patent Application No. PCT/JP2016/060704.

Jun. 5, 2018 Office Action issued in Japanese Patent Application No. 2017-510198.

Jun. 19, 2019 Office Action issued in Chinese Application No. 201680017411.9.

* cited by examiner

SPECTACLE LENS, METHOD OF MANUFACTURING THE SAME, AND SPECTACLES

CROSS-REFERENCE TO RELATED APPLICATION

This application is a Continuation of PCT International Application No. PCT/JP2016/060704 filed on Mar. 31, 2016, which was published under PCT Article 21(2) in Japanese and claims priority under 35 U.S.C. § 119 (a) to Japanese Patent Application No. 2015-073844, filed on Mar. 31, 2015. The above applications are hereby expressly incorporated by reference, in their entirety, into the present application.

TECHNICAL FIELD

The present disclosure relates to a spectacle lens, a method of manufacturing the spectacle lens, and spectacles having the spectacle lens.

BACKGROUND ART

In general, a spectacle lens has one or more functional layers for various functions on a lens base material. For example, it is possible to prevent a dirt or dust from adhering to a surface of the spectacle lens due to electrostatic charging or reducing the adhesion amount by providing a conductive layer (also referred to as an antistatic layer) on the lens base material. As such a conductive layer, JP 2012-522259 A (hereby, particularly incorporated by reference in its entirety) discusses a conductive layer containing tin oxide.

SUMMARY OF INVENTION

The spectacle lenses are worn on a spectacle wearer for a long time after being processed as spectacles. Therefore, the conductive layer provided on the spectacle lens is desired to continuously provide excellent conductivity (antistatic property) during the long time use. However, in the inventor's study, it was found that the conductive layer discussed in JP 2012-522259 A has a significant conductivity change over time.

According to an aspect of the present disclosure, there is provided a spectacle lens having a conductive layer capable of providing an excellent antistatic property for a long time.

According to an aspect of the present disclosure, there is provided a spectacle lens including a tin oxide layer on a lens base material, wherein the tin oxide layer has a composition gradient in which an oxygen content rate as an atomic percentage increases from the lens base material side to the other side.

In the present disclosure, it is assumed that the composition gradient of the tin oxide layer is measured on the basis of an X-ray photoelectron spectroscopy. The X-ray photoelectron spectroscopy is also called an electron spectroscopy for chemical analysis (ESCA) or X-ray photoelectron spectroscopy (XPS), and will be also abbreviated as "ESCA" in the following description. In addition, in the following description, it is assumed that a numerical value regarding a composition of the tin oxide layer such as an oxygen content rate is a numerical value based on an atomic percentage measured through the ESCA method unless specified otherwise. It is assumed that, for measurement using the ESCA method, the oxygen atoms are measured using an intensity of the spectrum "O1s_1," and the tin atoms are measured using an intensity of the spectrum "Sn3d5_1."

The following description is based on the inventor's assumption, and is not intended to limit the present disclosure. However, the inventor conceives that the composition gradient of the tin oxide layer described above contributes to temporal reduction of conductivity. Specifically, it may be described as follows.

If tin oxide is expressed as a composition formula $Sn_xO_y$, several values may be applied to the factors "x" and "y." It is known that, among such values, the values "x=1" and "y=2" ($SnO_2$) provide a stable stoichiometric composition structure.

In this regard, in the technique discussed in JP 2012-522259 A, the tin oxide is expressed as "$SnO_2$." However, it is difficult to obtain conductivity from its stoichiometric composition without oxygen deficiency or impurity addition (doping). In JP 2012-522259A, there is no description regarding addition of impurities to the conductive layer. Therefore, it is considered that the conductive layer described in the JP 2012-522259A obtains conductivity due to oxygen deficiency from the stoichiometric composition. However, the tin oxide having oxygen deficiency from the stoichiometric composition can easily receive oxygen as the stoichiometric composition becomes stable. Therefore, it is conceived that the tin oxide can be easily oxidized by oxygen in the air overtime. The inventor conceives that this is the main reason of the temporal change of the conductivity in the conductive layer discussed in JP 2012-522259 A. Here, the conductive layer discussed in JP 2012-522259 A is a layer deposited under an ion-assisted atmosphere, that is, an ion-assisted deposition layer as described in claim 1 of JP 2012-522259 A. The tin oxide layer deposited through the ion-assisted deposition has a uniform composition inside the layer and does not have a composition gradient in the oxygen content rate in the ESCA measurement.

In contrast, the tin oxide layer provided in the spectacle lens according to an aspect of the present disclosure is not easily oxidized because the oxygen content rate is higher in the other side rather than the lens base material side, that is, the side more susceptible to the oxygen in the air during fabrication and use of the spectacles. The inventor guesses that this contributes to suppression of conductivity degradation in the tin oxide layer caused by oxidation, and as a result, it is possible to obtain an excellent antistatic property for a long time.

However, as described above, the aforementioned description is based on the inventor's estimation and is not intended to limit the present disclosure.

According to an aspect, in the tin oxide layer, an oxygen content rate in a surface layer portion of the other side is higher than an oxygen content rate in a surface layer portion of the lens base material side and is set to be higher than 60 at % and equal to or lower than 70 at %. Here, the surface layer portion refers to a region from the surface of the tin oxide layer to a depth of 30% of the thickness of the tin oxide layer.

According to an aspect, in the tin oxide layer, the oxygen content rate in the surface layer portion of the lens base material side is equal to or higher than 45 at % and equal to or lower than 60 at %.

According to an aspect, the tin oxide layer is included in a multilayer film selected from a group consisting of a multilayer antireflection film and a multilayer reflection film. Here, the multilayer antireflection film refers to a multilayer film having a property of preventing reflection of light having a particular wavelength range, and the multilayer reflection film refers to a multilayer film having a property of reflecting light having a particular wavelength range. These will be described below in more details.

According to another aspect of the disclosure, there is provided a method of manufacturing the spectacle lens, the method including: a process of forming a tin oxide film on a lens base material through non-ion-assisted vacuum deposition; and a process of irradiating energized oxygen onto a surface of the formed tin oxide film.

According to an aspect, the energized oxygen includes oxygen ions.

According to an aspect, the oxygen ions are irradiated with an irradiation energy satisfying Formula 1:

$$Y>(X/100) \quad \text{Formula 1}$$

where Y denotes a thickness (unit: nm) of the tin oxide film formed through the vacuum deposition, and X denotes irradiation energy (unit: eV).

According to an aspect, the irradiation of the oxygen ions is performed for 18 to 300 seconds.

According to still another aspect of the present disclosure, there is provided spectacles including: the spectacle lens and a frame fitted with the spectacle lens.

According to an aspect of the present disclosure, it is possible to provide a spectacle lens, a method of manufacturing the spectacle lens, and spectacles provided with the spectacle lens, capable of providing an excellent antistatic property for a long time.

DESCRIPTION OF EMBODIMENTS

[Spectacle Lens and Method of Manufacturing the Same]

The spectacle lens according to an aspect of the present disclosure is a spectacle lens having a tin oxide layer on a lens base material. The tin oxide layer of the spectacle lens has a composition gradient in which the oxygen content rate based on an atomic percentage increases from the lens base material side to the other side.

In the following description, the spectacle lens will be described in more details.

<Lens Base Material>

As the lens base material, various types of lens base materials used in a typical spectacle lens, such as a plastic lens base material and a glass lens base material, may be employed without any limitation. The lens base material may be a plastic lens base material in terms of a light weight, an anti-crack property, and the like. As a specific example, without a particular limitation, the resin of the plastic lens base material may include styrene resin including (meth) acrylic resin, polycarbonate resin, allylic resin, allyl carbonate resin such as diethyleneglycol bisarylcarbonate resin (CR-39), vinyl resin, polyester resin, polyether resin, urethane resin obtained through a reaction between an isocyanate compound and a hydroxy compound such as diethylene glycol, thiourethane resin obtained through a reaction between an isocyanate compound and a polythiol compound, transparent resin obtained by curing a polymeric composition containing a (thio) epoxy compound having one or more disulfide bonds in a molecule, and the like. In addition, the lens base material may include a non-colored material (achromatic lens) or a colored material (chromatic lens). The lens base material has, for example, a refractive index of approximately 1.60 to 1.75. However, the refractive index of the lens base material maybe within the aforementioned range or maybe deviated from the aforementioned range upward or downward without a particular limitation.

The spectacle lens may include various types of lenses such as a fixed focal lens, a multifocal lens, and a progressive refraction lens. The type of the lens is determined depending on a surface shape of both sides of the lens base material. In addition, the surface of the lens base material may include a convex face, a concave face, or a flat face. In a typical lens base material and a typical spectacle lens, the object-side surface is a convex face, and the eye-side surface is a concave face. However, the present disclosure is not limited thereto. The tin oxide layer may be provided in the object side of the spectacle lens, in the eye side, or in both sides.

<Tin Oxide Layer>

In the aforementioned spectacle lens, the tin oxide layer is directly provided on the lens base material or indirectly by interposing at least one another layer. In addition, the tin oxide layer has a composition gradient in which the oxygen content rate increases from the lens base material side toward the other side. Here, the increase of the oxygen content rate maybe continuous or stepwise from the lens base material side to the other side, that is, in the thickness direction. The oxygen content rate may be different in three or more places in the thickness direction and increase from the lens base material side to the other side. In addition, as described above, it is assumed that the electron spectroscopy for chemical analysis (ESCA) is employed to measure the composition gradient of the tin oxide layer, in the present disclosure.

In the present disclosure, the tin oxide layer refers to a layer containing tin oxide as an element, may refer to a layer containing tin oxide in most of the elements, or may refer to a layer containing tin oxide inmost of the elements except for unintentionally mixed impurities. In addition, the tin oxide contained in the tin oxide layer may have a plurality of structures having different oxidation states as described below in more details. The inventor guesses that, as a result, the tin oxide layer has the aforementioned composition gradient.

A possible tin oxide structure will be described.

As described above, if the tin oxide is expressed as a compositional formula SnxOy, several values maybe set for the factors "x" and "y." When "x=1," and "y=2" ($SnO_2$), the stoichiometric composition has a stable structure. In addition, when "x=3," and "y=4" ($Sn_3O_4$), or when "x=1," and "y=1" ($SnO$), a metastable structure is obtained. The tin oxide layer can provide conductivity when oxygen is deficient from such a stable structure or a metastable structure. Here, the tin oxide having the stable structure and the metastable structure has an oxygen content rate and a tin content rate as follows on the basis of its compositional formula.

TABLE 1

| | at% (atomic percentage) | |
|---|---|---|
| | Sn | O |
| $SnO_2$ | 33% | 67% |
| $Sn_3O_4$ | 43% | 57% |
| SnO | 50% | 50% |

Since a quantitative analysis precision of the ESCA is set to several percentages, tin oxide having an oxygen content rate higher than 60 at % and equal to or lower than 70 at % in the ESCA measurement is considered as being relatively stable if it has a stable structure of $SnO_2$ or an oxidized state similar thereto. Therefore, in order to provide an excellent antistatic property for a long time, an oxygen content rate of the tin oxide layer in a surface layer portion of the other side opposite to the lens base material side is higher than the oxygen content rate in a surface layer portion of the lens base material side and may be higher than 60 at % and equal to or lower than 70 at %.

From Table 1 described above, it is conceived that tin oxide having an oxygen content rate equal to or higher than 45 at % and equal to or lower than 60 at % has a metastable structure of $Sn_3O_4$ or SnO, or has an oxidation state similar thereto, which is relatively stable. Therefore, in order to allow the aforementioned tin oxide layer to provide the more excellent antistatic property for a long time, the oxygen content rate in the surface layer portion of the lens base material lower than the oxygen content rate in the surface layer portion in the other side may be set to be equal to or higher than 45 at % and equal to or lower than 60 at %.

As described above, the tin oxide layer may contain tin oxide having a metastable structure of $Sn_3O_4$ or SnO or tin oxide having an oxidation state similar thereto in the surface layer portion of the lens base material side and contain tin oxide having a stable structure $SnO_2$ or tin oxide having an oxidation state similar thereto in the surface layer portion of the other side. In the tin oxide layer, a region between both the surface layer portions containing tin oxide having such an oxidation state (hereinafter, referred to as an "intermediate region") may contain tin oxide having an oxygen content rate higher than that of the surface layer portion of the lens base material side and lower than that of the surface layer portion of the other side. It is conceived that, if the tin oxide contained in the intermediate region has an oxidation state significantly different from that of tin oxide $SnO_2$ having a stable structure or tin oxide $Sn_3O_4$ or SnO having a metastable structure, this contributes to exhibition of excellent conductivity. In addition, inventor conceives that, if such an intermediate region may be protected by the surface layer portion opposite to the lens base material side containing the aforementioned tin oxide having the relatively stable state and may be protected by the surface layer portion of the lens base material side containing the aforementioned tin oxide having the relatively stable state, it is possible to more reduce a change of the oxidation state of the intermediate region and thus allow the tin oxide layer to provide the more excellent antistatic property for a long time.

The tin oxide layer has a thickness equal to that of the conductive layer (antistatic layer) generally provided in the spectacle lens, but not particularly limited thereto. For example, the tin oxide layer may have a thickness of 3.0 to 30.0 nm as a physical thickness, or may have a thickness of 3.0 to 17.0 nm. The thickness of the tin oxide layer can be controlled on the basis of a film deposition condition. In addition, in the following description, it is assumed that the thickness refers to a physical thickness unless specified otherwise. Furthermore, although at least one tin oxide layer is included in the spectacle lens according to an aspect of the present disclosure, two or more tin oxide layers may also be included.

<Manufacturing Method>

The spectacle lens according to an aspect of the present disclosure may be manufactured using any method as long as the tin oxide layer described above is provided on the lens base material. A method of manufacturing the spectacle lens described above according to an aspect of the present disclosure may include a process of forming a tin oxide film on a lens base material through vacuum deposition without ion assistance (hereinafter, referred to as a "vacuum deposition process") and a process of irradiating energized oxygen onto a surface of the formed tin oxide film (hereinafter, referred to as a post-oxidation process).

The manufacturing method will now be described in more details.

(Vacuum Deposition Process)

In the technique of JP 2012-522259 A described above, the conductive layer containing tin oxide is formed through ion-assisted deposition. The ion-assisted deposition is a vapor deposition process performed by irradiating an assistance gas (ionization gas) during the deposition. However, in the method of manufacturing the spectacle lens according to an aspect of the present disclosure, vacuum deposition is performed without ion assistance to form the tin oxide film on the lens base material in the vacuum deposition process. The inventor guesses that any one of tin oxide SnO or $Sn_3O_4$ having the metastable structure described above or tin oxide having an oxidation state similar thereto can be deposited on the lens base material through the non-ion-assisted vacuum deposition. The tin oxide having such a state has an insulation property or insufficient conductivity. The inventor conceives that at least a part of the tin oxide contained in the tin oxide film is oxidized by introducing oxygen in the post-oxidation process, so as to provide conductivity or improve conductivity. The post-oxidation process will be described below in details.

There is no particular limitation in the vacuum deposition as long as ion assistance is not performed. For example, the vacuum deposition may performed under the oxidation atmosphere by using tin oxide such as $SnO_2$ as a deposition material (vapor deposition source), setting a voltage as an evaporation condition to 5 to 10 kV, setting an electric current to 10 to 100 mA, and setting a substrate temperature of the substrate for placing a deposition target to 20 to 100° C. The oxidizing atmosphere refers to an oxygen ($O_2$) atmosphere containing oxygen, for example, by 10% or more on a volume basis, and an oxygen ($O_2$) atmosphere of 100% may also be acceptable. Alternatively, vacuum deposition may be performed while an oxygen ($O_2$) gas is introduced into the atmosphere. In addition, a vacuum degree inside the vacuum deposition apparatus may be set to, for example, 1E-4 to 1E-2 Pa. The vacuum deposition time is not particularly limited, and may be set depending on a thickness of the tin oxide layer to be provided on the lens base material of the spectacle lens.

The vacuum deposition described above may be performed using a vapor deposition source available in the market or prepared through a method known in the art and a vapor deposition apparatus known in the art.

(Post-oxidation Process)

In the post-oxidation process, energized oxygen is irradiated onto the surface of the tin oxide film through the vacuum deposition described above. Here, the energized oxygen refers to oxygen having an activation state higher than that of oxygen molecules ($O_2$) such as oxygen ions or oxygen radicals. Here, the oxygen radicals include oxygen free radicals such as hydroxyl radicals or superoxide anions. The inventor guesses that oxygen is introduced (implanted) from the surface opposite to the lens base material side of the tin oxide film by irradiating energized oxygen onto the tin oxide film formed through vacuum deposition, and the tin oxide film is oxidized from the region close to the introduction-side surface, so that the tin oxide layer described above having the aforementioned composition gradient is obtained. That is, it is conceived that, through the post-oxidation process, a composition gradient having the higher oxygen content rate in the region closer to the introduction-side surface can be provided in the tin oxide film.

The energized oxygen can be generated and irradiated using the method known in the art. For example, the energized oxygen may be generated through irradiation using an ion gun (ion arm), ion beam irradiation, or ion plating, or using a radio frequency (RF) radical source and may be irradiated onto the surface of the tin oxide film. In the following description, an aspect of irradiating oxygen ions as the energized oxygen will be described by way of example.

As described above, it is conceived that, if oxygen ions are irradiated onto the introduction-side surface of the tin oxide film formed through vacuum deposition, oxygen is introduced (implanted) from the introduction-side surface to generate a composition gradient such that the oxygen content rate increases in a region closer to the introduction-side surface, and the oxygen content rate decreases in a region closer to the lens base material-side surface. The amount of oxygen introduced into the tin oxide film increases as the irradiation energy of the oxygen ion increases, and the irradiation time increases. Therefore, when the oxygen introduction amount becomes excessive, the tin oxide contained in the tin oxide film formed through vacuum deposition becomes $SnO_2$ having a stoichiometric composition or has an oxidation state similar thereto due to progression of oxidation. It is conceived that, as a result, the tin oxide layer subjected to irradiation of oxygen ions provides no conductivity or has insufficient conductivity. Therefore, the irradiation condition of oxygen ions may be controlled such that the tin oxide film formed through vacuum deposition becomes the tin oxide layer having the aforementioned composition gradient after irradiation of oxygen ions. As such an irradiation condition, the irradiation energy may satisfy the following Formula 1. In addition, the oxygen ion irradiation time may be set to 18 to 300 seconds. Furthermore, as the irradiation energy increases, sputtering (etching) is generated so that the thickness of the tin oxide film formed through the vacuum deposition decreases in some cases. In order to suppress such reduction of the thickness, the oxygen ion irradiation energy may be set to be lower than 500 eV, or may be equal to or lower than 400 eV.

$$Y > (X/100) \quad \text{Formula 1}$$

where Y denotes a thickness of the tin oxide film formed through vacuum deposition (unit: nm), and X denotes irradiation energy (unit: eV).

Through the post-oxidation process described above, oxygen is introduced (implanted) from the introduction-side surface to the tin oxide film formed in the vacuum deposition process, so that the oxygen content rate of the surface layer portion of the introduction-side surface side (that is, the surface layer portion in the other side opposite to the lens base material side) maybe be higher than the oxygen content rate of the surface layer portion of the lens base material side, or may be higher than 60 at % and equal to or lower than 70 at % as described above. In addition, the oxygen content rate of the surface layer portion of the lens base material side may be set to be equal to or higher than 45 at % and equal to or lower than 60 at % as described above.

Although the post-oxidation process as a case where oxygen ions are used as the energized oxygen has been described above, the aforementioned composition gradient may be similarly generated in the tin oxide film formed through the vacuum deposition process by irradiating energized oxygen other than oxygen ions to introduce (implant) oxygen from the introduction-side surface.

In order to form the conductive layer containing tin oxide through ion-assisted deposition as described in JP 2012-522259 A, tin oxide is oxidized under ion assistance while tin oxide is evaporated by heating the deposition material (such as a sintered body of tin oxide) in vacuum (irradiation of ions during vapor deposition), so that a tin oxide film containing an appropriate amount of oxygen deficiency is obtained. In order to obtain stable conductivity, the amount of oxygen deficiency (oxidation degree) may be stabilized. This is because, if a deviation is generated in the oxidation degree of tin oxide during manufacturing a plurality of spectacle lenses, a deviation of conductivity is generated in the manufactured spectacle lenses. In this regard, a deposition rate is known as a factor for determining the oxidation degree for the tin oxide film containing oxygen deficiency formed by the ion-assisted deposition. If the deposition rate changes, the oxidation degree caused under ion assistance also changes. Specifically, if the deposition rate is delayed, ion-assisted oxidation is more easily progressed, so that the oxidation degree increases. If the deposition rate is expedited, the ion-assisted oxidation is not easily progressed, so that the oxidation degree decreases. Therefore, in order to reduce a deviation of conductivity in a plurality of spectacle lenses in formation of the conductive layer containing tin oxide through ion-assisted deposition, the deposition rate may be stabilized. However, in general, a deviation of the deposition rate is easily generated in tin oxide. This is because the deposition material of the tin oxide is typically a sublimation material, which is difficult to dissolve and has a low sublimation temperature. For this reason, if the conductive layer containing tin oxide is formed through ion-assisted deposition as discussed in JP 2012-522259 A, a deviation in quality (conductivity) is easily generated between the manufactured spectacle lenses. In contrast, in the method of manufacturing the spectacle lens according to an aspect of the present disclosure described above, the conductivity can be provided or improved by irradiating energized oxygen after the vacuum deposition process without using the ion-assisted deposition. The inventor guesses that, in such a manufacturing method, generation or improvement of conductivity does not relate to the deposition rate, and it is possible to prevent a deviation of conductivity unlike the ion-assisted deposition and manufacture the spectacle lens having stable quality (conductivity).

<Conductivity (Surface Electric Resistance)>

The tin oxide layer described above may have a surface electric resistance equal to or lower than $1E10\Omega$ when it is measured on a surface of the tin oxide layer opposite to the lens base material side. In addition, the spectacle lens having such a tin oxide layer according to an aspect of the present disclosure may have a surface electric resistance equal to or lower than $1E9\Omega$ when it is measured on the outermost surface of the spectacle lens. Both the former and latter surface electric resistances may be set to a range of 1E4 to 1E10Ω, or may be set to a range of 8E4 to 1E9Ω. Here, the surface electric resistance may be measured using a resistivity meter known in the art. A specific example of the measurement method is described in the following example.

<Configuration of Spectacle Lens>

The spectacle lens includes at least the lens base material and the tin oxide layer, and may include any one or more other layers. As such a layer, various functional layers typically provided in the spectacle lens may be employed. Here, the "functional layer" refers to a layer that can provide a desired property in the spectacle lens. The desired property may include, for example, a property of preventing reflection of light having a particular wavelength range (anti-reflection property) or a property of reflecting light having a particular wavelength (refection property). For example, the functional layer for providing the anti-reflection property may be a multilayer antireflection film, and the functional layer for providing the reflection property may be a multilayer reflection film. The light having a particular wavelength range may include visible light (for example, a wavelength of 380 to 780 nm), ultraviolet rays (for example, a wavelength of 280 to 400 nm), blue light (for example, a wavelength of 400 to 500 nm), infrared rays (for example, a wavelength of 780 to 2500 nm), or the like. Such a multilayer film may prevent reflection of light having a particular wavelength range or may reflect light having a particular wavelength range by stacking two or more layers having different refractive indices (high refractive index layer and low refractive index layer). A configuration of such a multilayer film is well known in the art. In one aspect, at least one tin oxide layer described above may be included in such a multilayer film.

The functional layers that can be provided in the aforementioned spectacle lens may include a hard coat layer for improving durability, a polarization layer for providing polarization performance, a photochromic layer for providing photochromic performance, a primer layer for improving adherence between the lens base material and other layers or adherence between two layers, and the like.

For example, a high refractive index material of the high refractive index layer of the multilayer film may include zirconium oxide (for example, $ZrO_2$), tantalum oxide (for example, $Ta_2O_5$), niobium oxide (for example, $Nb_2O_5$), titanium oxide (for example, $TiO_2$), and two or more complex oxides selected from a group consisting of these oxides. In addition, a low refractive index material of the low refractive index layer of the multilayer film may include, for example, silicon oxide (for example, $SiO_2$) aluminum oxide (for example, $Al_2O_3$), magnesium fluoride (for example, $MgF_2$), calcium fluoride (for example, $CaF_2$), aluminum fluoride (for example, $AlF_3$), and two or more complex oxides selected from a group consisting of these oxides. The high refractive index layer and the low refractive index layer may be formed through various film formation methods such as vacuum deposition, ion-assisted deposition, ion plating, and sputtering. The number of the low refractive index layers and the number of the high refractive index layers included in the multilayer film are set to one or more layers, may be set to two or more layers, or may be set to three or more layers. The number of the low refractive index layers and the number of the high refractive index layers included in the multilayer film may be set to four or more layers, five or more layers, or six or more layers as well. A total number of layers of the multilayer film is not particularly limited, but may be appropriately set so as to obtain a desired anti-reflection property or a desired reflection property (hereinafter, totally referred to as a "reflection property"). In addition, the thickness of each layer may be determined by an optical design based on a method well known in the art depending on a desired reflection property. In addition, in one aspect, the multilayer film of the spectacle lens according to an aspect of the present disclosure may include the tin oxide layer described above.

[Spectacles]

According to another aspect of the present disclosure, there can be provided spectacles including the aforementioned spectacle lens according to an aspect of the present disclosure, and a frame fitted with the spectacle lens. The spectacle lens has been described above. Techniques well known in the art may be applied to other features of the spectacles without a particular limitation.

EXAMPLES

Examples of the present disclosure will be further described below. However, the present disclosure is not limited by the aspects described in the examples.

Example 1

In the following way, a spectacle lens having a multilayer antireflection film was fabricated.

Figure 1:
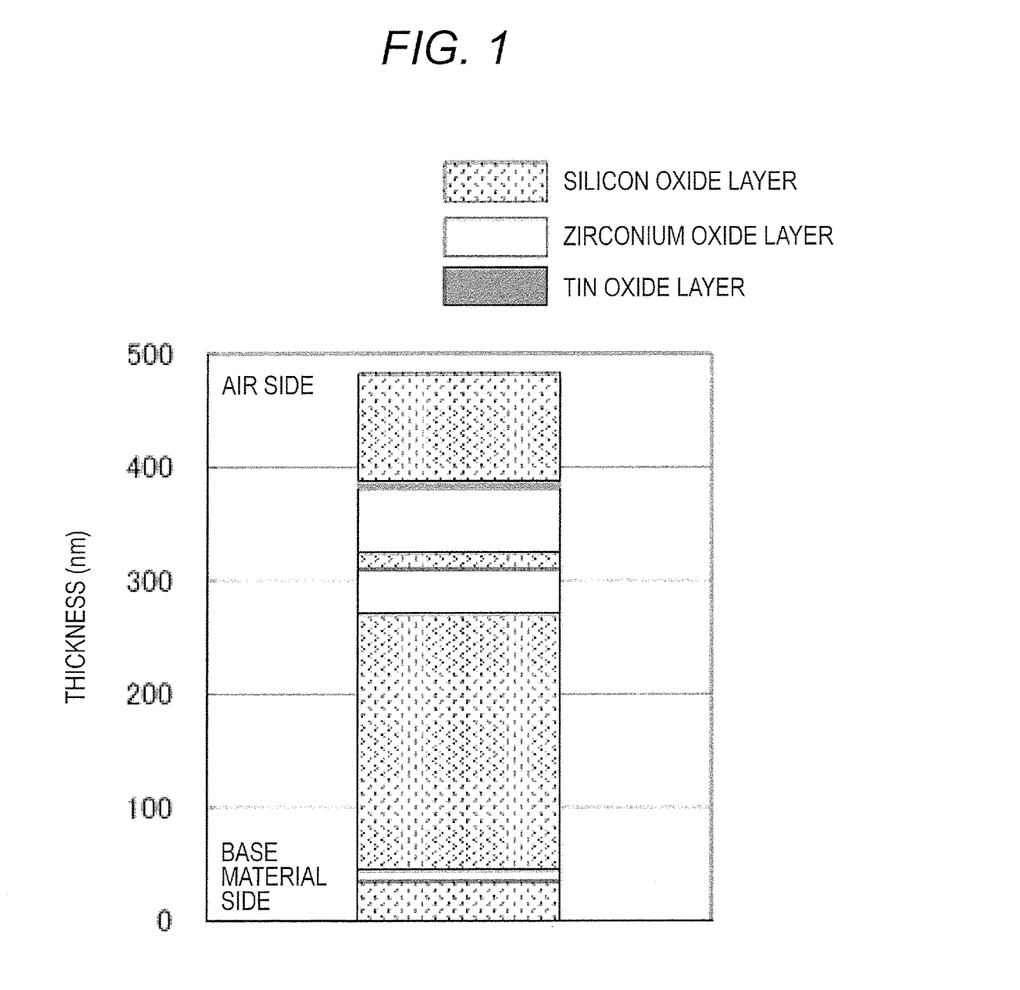
FIG. 1 illustrates a film structure (design thickness) of a multilayer antireflection film formed on a lens base material in Example 1.

The multilayer antireflection film was formed on a convex face-side surface of the plastic lens base material of the hard coat layer from the first layer of the base material side toward the air side with a design thickness of FIG. 1 (including a first layer: silicon oxide layer (35.0 nm), a second layer: zirconium oxide layer (10.3 nm), a third layer: silicon oxide layer (225.7 nm), a fourth layer: zirconium oxide layer (39.0 nm), fifth layer: a silicon oxide layer (14.6 nm), a sixth layer: zirconium oxide layer (57.0 nm), a seventh layer: tin oxide layer (7.0 nm), and an eighth layer: silicon oxide layer (93.8 nm), where the parenthesized numerical values denote design thicknesses). The multilayer antireflection film includes a zirconium oxide layer formed of a deposition material of $ZrO_2$ through ion-assisted deposition as the high refractive index layer and a silicon oxide layer formed of a deposition material of $SiO_2$ through ion-assisted deposition as the low refractive index layer.

This multilayer antireflection film has a tin oxide layer between the zirconium oxide layer corresponding to the sixth layer and the silicon oxide layer corresponding to the eighth layer from the base material side. The tin oxide layer was formed by forming the zirconium oxide layer corresponding to the sixth layer, forming a tin oxide film on a surface of the zirconium oxide layer corresponding to the sixth layer through non-ion-assisted vacuum deposition, and then irradiating oxygen ions. The vacuum deposition condition and the oxygen ion irradiation condition for forming the tin oxide film are illustrated in the following Table 2. The thickness of the tin oxide film formed through vacuum deposition was controlled on the basis of a deposition time.

TABLE 2

| <Vacuum Deposition Process> | Deposition material | $SnO_2$ sintered body (no doping, diameter of 18 mm, and thickness of 7 mm) |
|---|---|---|
| Vacuum deposition | Substrate temperature | 65° C. |

TABLE 2-continued

| condition (no ion assistance) | Evaporation condition | Voltage of 6 kV and current of 30 to 35 mA |
|---|---|---|
| | Introduced gas | O2 (15 sccm) |
| | Thickness of the formed tin oxide film | 7.0 nm |
| <Post-oxidation process> Oxygen ion irradiation condition | Ion gun (ion arm) | Irradiation energy of 500 eV (oxygen ions were irradiated at a voltage of 500 V and a current of 250 mA by introducing O₂ with the amount of 35 sccm) |
| | Irradiation time | 60 sec |

Figure 2:
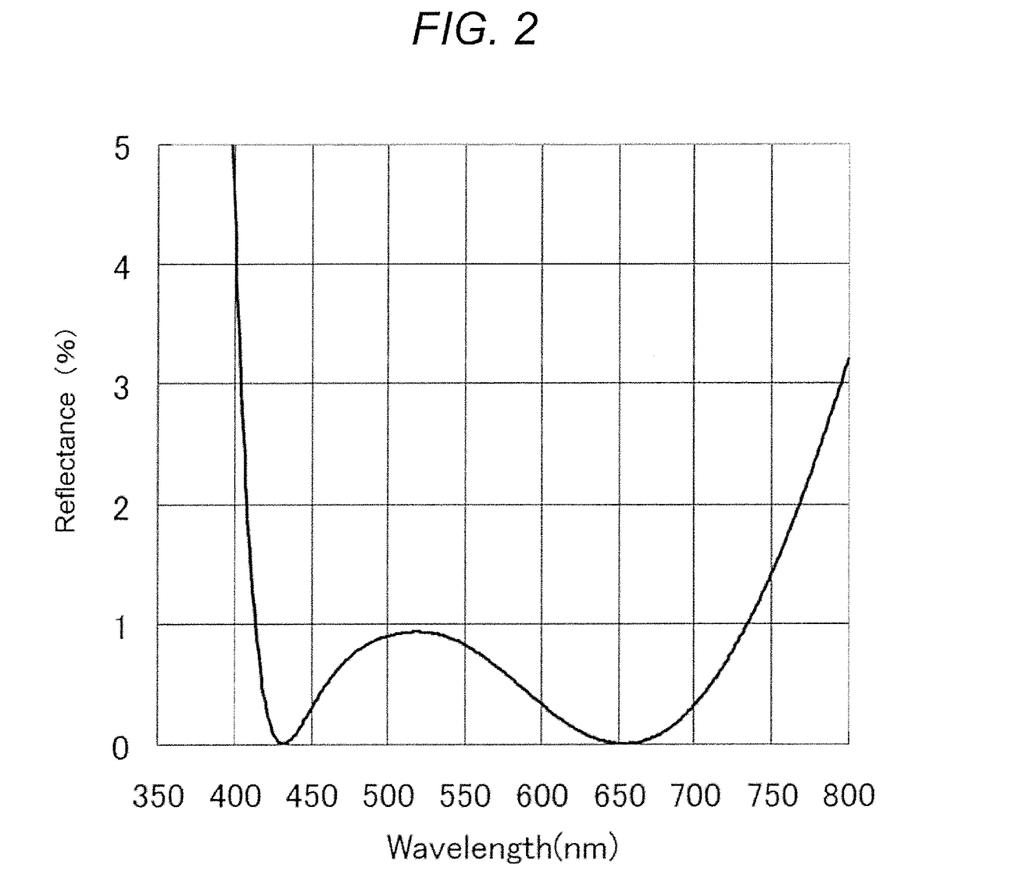
FIG. 2 illustrates a reflection spectrum on a convex face of a spectacle lens fabricated in Example 1.

Using a spectrophotometer, Model No. U-4100, produced by Hitachi, Ltd., a reflection spectrum on a convex face of the spectacle lens fabricated in Example 1 was obtained. The obtained reflection spectrum is illustrated in FIG. 2. From the reflection spectrum of FIG. 2, it was recognized that the spectacle lens fabricated in Example 1 has an anti-reflection capability within a visible light range. From this result, it was recognized that the multilayer film fabricated in Example 1 serves as an antireflection film.

Comparative Example 1

Similar to Example 1, the spectacle lens was fabricated except that the tin oxide layer corresponding to the seventh layer is formed through ion-assisted deposition with oxygen ion assistance (by applying a voltage of 500 V and a current of 200 mA, and by setting a thickness of the formed tin oxide layer to 7 nm).
<Check of Temporal Change of Surface Electric Resistance>
For the spectacle lens of Example 1 and the spectacle lens of Comparative Example 1, the surface electric resistance on the convex face of the spectacle lens was measured over time at an atmospheric temperature of 60° C. (under the accelerated test environment). The surface electric resistance was measured using the following method.

Figure 3:
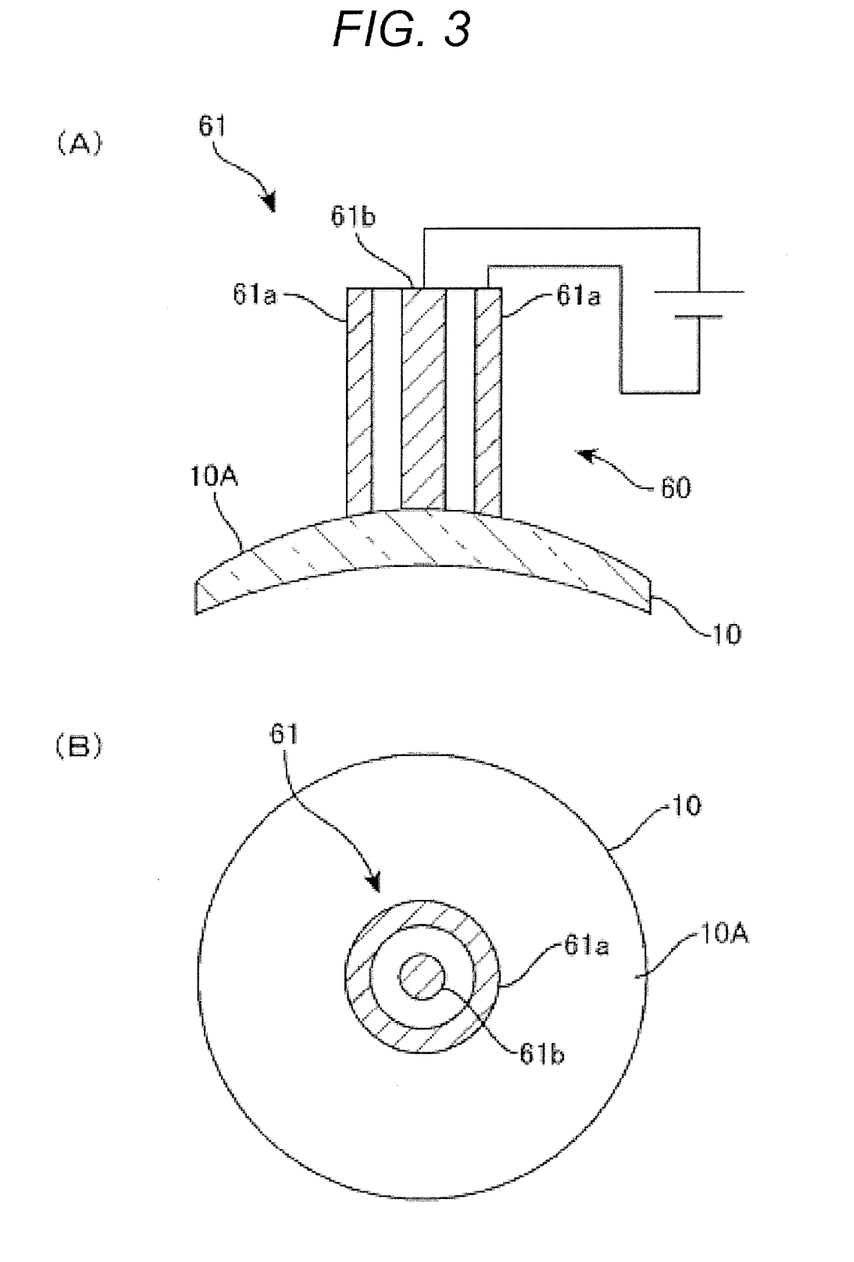
FIG. 3 is an explanatory diagram illustrating a method of measuring a surface electric resistance.

FIGS. 3(A) and 3(B) illustrate a situation in which the surface electric resistance is measured on the convex face of the spectacle lens. The surface electric resistance of the convex face 10A of the spectacle lens 10 was measured by allowing a ring probe 61 to make contact with the convex face 10A of the spectacle lens 10. As a measurement device 60, a high resistivity meter, HIRESTA-UP Model MCP-HT450 produced by MITSUBISHI CHEMICAL ANALYTECH CO., LTD. was employed. The employed ring probe 61 was an URS type having a pair of electrodes, in which an outer ring electrode 61a has an outer diameter of 18 mm and an inner diameter of 10 mm, and an inner circular electrode 61b has a diameter of 7 mm. The surface electric resistance on the convex face of the spectacle lens was measured by applying a voltage of 1000 to 10 V between the electrodes.

Figure 4:
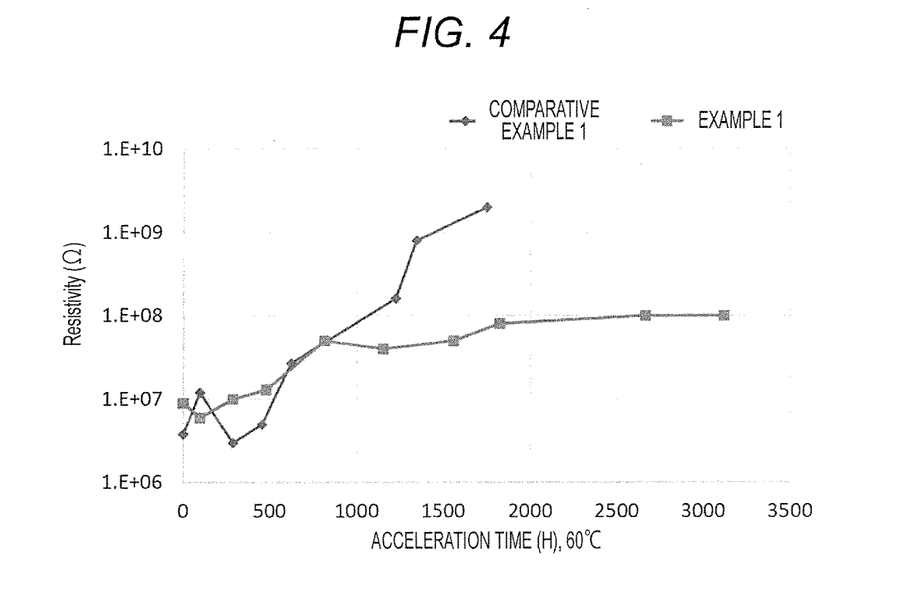
FIG. 4 is a graph illustrating a temporal change of the surface electric resistance in the spectacle lenses of Example 1 and Comparative Example 1.

FIG. 4 is a graph illustrating a temporal change of the surface electric resistance in the spectacle lens of Example 1 and the spectacle lens of Comparative Example 1. From the result of FIG. 4, it is recognized that the surface electric resistance in the spectacle lens of Example 1 less changes over time, compared to the spectacle lens of Comparative Example 1, that is, an excellent antistatic property can be provided for a long time with less temporal reduction of the antistatic property.

Figure 5:
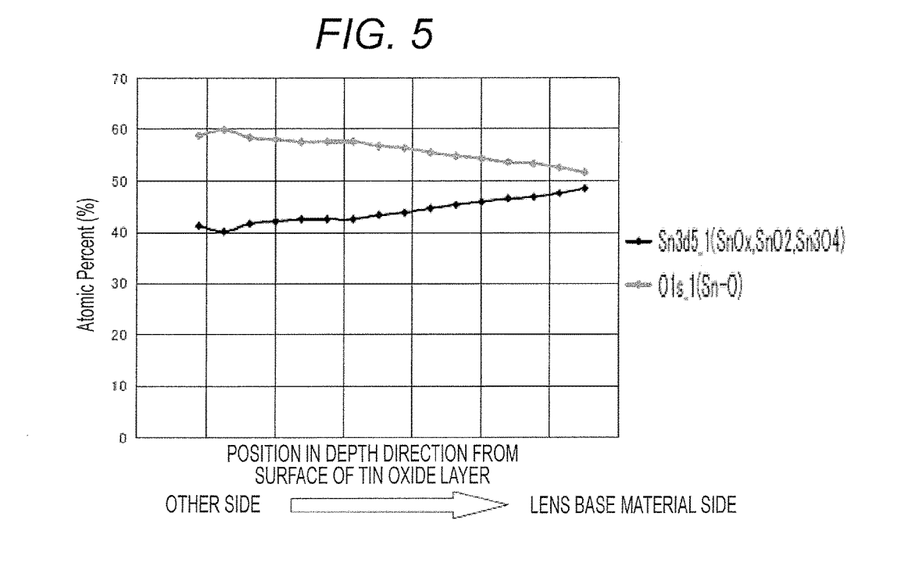
FIG. 5 illustrates a result of ESCA-based elemental analysis for the tin oxide layer fabricated in Example 1.

<Composition Analysis for Tin Oxide Layer Fabricated in Example 1>
A composition of the tin oxide layer formed on a glass substrate using the method of Example 1 was analyzed on the ESCA basis. The ESCA analysis was performed under the following analysis condition.
(ESCA Analysis Condition)
Model: VG Theta Probe produced by Thermo Fisher Scientific Corporation
Irradiated X-ray single crystal spectroscopy: AlKα
X-ray spot diameter: 800×400 1.µm (elliptical)
Neutralization electron gun: not used
In the ESCA-based measurement, the measurement place can change in a depth direction depending on a photoelectron extraction angle. Therefore, a composition distribution in the depth direction of the tin oxide layer was evaluated by performing measurement while changing the extraction angle. FIG. 5 shows a result of obtaining the oxygen content rate and tin content rate in each depth position from the intensity of the spectrum "O1s_1" for oxygen atoms and the intensity of the spectrum "Sn3d5_1" for tin atoms. From the result of FIG. 5, it is recognized that the tin oxide layer fabricated in Example 1 has a composition gradient in which the oxygen content rate increases from the lens base material side to the other side.

In addition, the oxygen content rate in the surface layer portion opposite to the surface layer portion of the lens base material side is higher than 60 at % and equal to or lower than 70 at %, and the oxygen content rate in the surface layer portion of the lens base material side is equal to or higher than 45 at % and equal to or lower than 60 at %. Therefore, it is conceived that the surface layer portion of the lens base material side contains tin oxide of SnO or $Sn_3O_4$ having a metastable structure or tin oxide having a state similar thereto, and the surface layer portion of the other side contains tin oxide of $SnO_2$ having a stable stoichiometric composition structure or tin oxide having a state similar thereto.

[Review of Condition for Forming Tin Oxide Layer]
Under the same condition as that of the vacuum deposition in the vacuum deposition process of Example 1, the tin oxide films having various thicknesses were formed on a glass substrate surface by changing the thickness of the tin oxide film by changing the deposition time (thicknesses of 3.3 nm, 6.0 nm, 8.9 nm, 11.7 nm, 14.2 nm, and 16.3 nm).

By repeating a process of irradiating oxygen ions onto a surface of the tin oxide film with various irradiation energies (at 200 eV, 300 eV, 500 eV, and 700 eV) and measuring the surface electric resistance on the surface of the tin oxide film using the aforementioned method during the irradiation, irradiation of oxygen ions were performed for a total irradiation time of 300 seconds. As a result, it was recognized that, by irradiating oxygen ions with the irradiation energy satisfying the aforementioned Formula 1, the tin oxide film having the surface electric resistance exceeding 1E11Ω before irradiation of oxygen ions provides a surface electric resistance of 1E6Ω or lower when 18 seconds elapses after the irradiation. This shows that, by irradiating oxygen ions under the aforementioned condition, oxygen is introduced (implanted) from the surface into the tin oxide film formed through the vacuum deposition process to generate a composition gradient, so that conductivity is provided or improved.

Under the irradiation energies of 500 eV and 700 eV, it was recognized that the thickness is reduced by 0.4 nm or larger. Therefore, in order to suppress reduction of the thickness, the irradiation energy may be lower than 500 eV and, for example, equal to or lower than 400 eV.

[Review of Dependence of Antistatic Property on Deposition Rate]
(Formation of Tin Oxide Layer Subjected to Post-oxidation Process)

A tin oxide film having a thickness of 3.5 nm was formed on a glass substrate through non-ion-assisted vacuum deposition. The vacuum deposition condition was set to that similar to Example 1, and the thickness was controlled on the basis of the deposition time. Oxygen $O_2$ was introduced into the surface of the tin oxide film formed in this way using an ion gun (ion arm) with the amount of 35 sccm, and oxygen ions were generated by applying a voltage of 200 V and a current of 100 mA. The generated oxygen ions were irradiated for 90 seconds.

The aforementioned process was performed by changing the deposition rate of vacuum deposition within a range of 0.5 to 1.5 nm/sec.

The surface electric resistance on the surface of the tin oxide layer obtained through the aforementioned process was measured using the method described above.

(Formation of Tin Oxide Layer Through Ion-assisted Deposition)

A tin oxide layer having a thickness of 3.5 nm was formed on a glass substrate through ion-assisted deposition. The ion-assisted deposition was performed in a similar way to that of Comparative Example 1 except that oxygen ions were assisted by applying a voltage of 200 V and a current of 100 mA, and the thickness is controlled on the basis of the ion-assisted deposition time.

The aforementioned process was performed by changing the deposition rate of the ion-assisted deposition within a range of 0.5 to 1.5 nm/sec.

The surface electric resistance on the surface of the tin oxide layer obtained through the aforementioned process was measured using the method described above.

Figure 6:
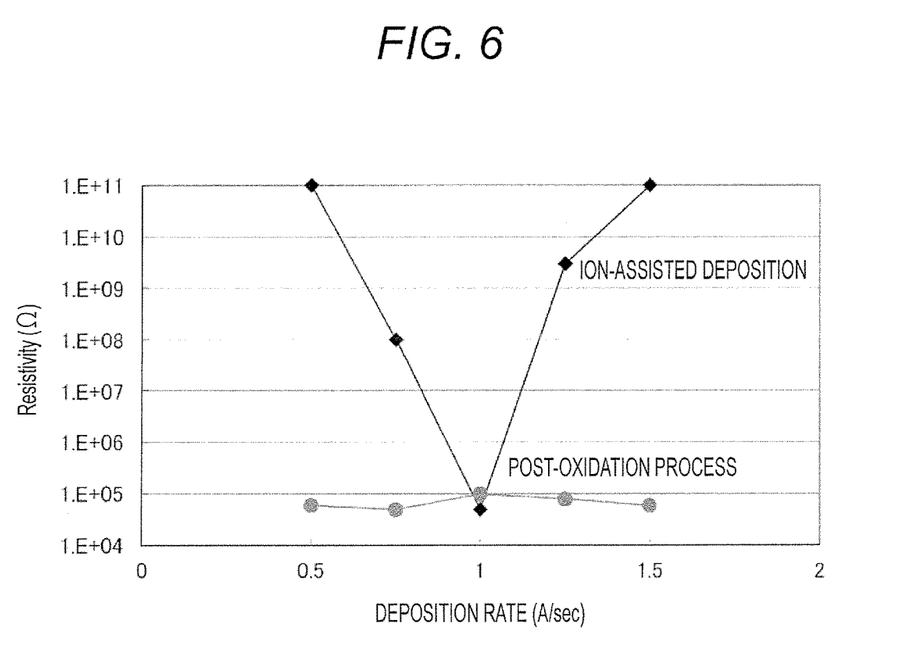
FIG. 6 illustrates a result of the review for dependency of the antistatic property against a deposition rate.

FIG. 6 is a graph obtained by plotting the surface electric resistance of the tin oxide layer formed through the aforementioned post-oxidation process and the surface electric resistance of the tin oxide layer formed through the ion-assisted deposition against the deposition rate. From the result of FIG. 6, it is recognized that the surface electric resistance of the ion-assisted deposition significantly changes depending on the deposition rate, and the antistatic property can be stably provided to the tin oxide layer regardless of the deposition rate using the manufacturing method including the post-oxidation process.

An aspect of the present disclosure is useful in the manufacturing field of the spectacle lens.

The embodiments disclosed herein are merely for illustrative purposes, and is not construed as a limitation. The scope of the disclosure is expressed in the attached claims instead of the aforementioned description, and it is intended to include all possible changes without departing from the spirit and scope of the disclosure, as disclosed in the claims and their equivalents.

What is claimed is:

1. A spectacle lens comprising a tin oxide layer on a lens base material,
    wherein the tin oxide layer has a composition gradient in which an oxygen content rate as an atomic percentage increases from the lens base material side to the other side the layer,
    wherein the tin oxide layer, an oxygen content rate in a surface layer portion of the other side is higher than an oxygen content rate in a surface layer portion of the lens base materials side and is set to be higher than 60 at % and equal to or lower than 70 at %.

2. The spectacle lens according to claim 1, wherein the tin oxide layer is included in a multilayer film selected from a group consisting of a multilayer antireflection film and a multilayer reflection film.

3. Spectacles comprising:
    the spectacle lens according to claim 1; and
    a frame fitted with the spectacle lens.

4. A method of manufacturing the spectacle lens, wherein the spectacle lens is the spectacle lens according to claim 1, and
    the method comprising:
    a process of forming a tin oxide film on a lens base material through non-ion-assisted vacuum deposition; and
    a process of irradiating energized oxygen onto a surface of the formed tin oxide film.

5. The method of manufacturing the spectacle lens according to claim 4, wherein the energized oxygen includes oxygen ions.

6. The method of manufacturing the spectacle lens according to claim 5, wherein the oxygen ions are irradiated with an irradiation energy satisfying Formula 1:

$$Y > (X/100) \qquad \text{Formula 1}$$

where Y denotes a thickness (unit: nm) of the tin oxide film formed through the vacuum deposition, and X denotes irradiation energy (unit: eV).

7. The method of manufacturing the spectacle lens according to claim 5, wherein the irradiation of the oxygen ions is performed for 18 to 300 seconds.

8. A spectacle lens comprising a tin oxide layer on a lens base material,
    wherein the tin oxide layer has a composition gradient in which an oxygen content rate as an atomic percentage increases from the lens base material side to the other side of the layer,
    wherein in the tin oxide layer, the oxygen content rate in the surface layer portion of the lens base material side is equal to or higher than 45 at % and equal to or lower than 60at.

* * * * *